United States Patent
Douskey et al.

(10) Patent No.: US 10,060,971 B2
(45) Date of Patent: Aug. 28, 2018

(54) ADJUSTING LATENCY IN A SCAN CELL

(71) Applicant: International Business Machines Corporation, Armonk, NY (US)

(72) Inventors: Steven M. Douskey, Rochester, MN (US); Raghu G. Gopalakrishnasetty, Bangalore (IN); Mary P. Kusko, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/238,528

(22) Filed: Aug. 16, 2016

(65) Prior Publication Data

US 2018/0052199 A1  Feb. 22, 2018

(51) Int. Cl.
  *G01R 31/28* (2006.01)
  *G01R 31/3177* (2006.01)
  *G01R 31/317* (2006.01)

(52) U.S. Cl.
  CPC ..... *G01R 31/2882* (2013.01); *G01R 31/3177* (2013.01); *G01R 31/31701* (2013.01)

(58) Field of Classification Search
  CPC .......... G01R 31/2882; G01R 31/31701; G01R 31/3177
  See application file for complete search history.

(56) References Cited

U.S. PATENT DOCUMENTS

| | | | |
|---|---|---|---|
| 5,592,493 A * | 1/1997 | Crouch .......... | G01R 31/318536 324/73.1 |
| 5,633,606 A | 5/1997 | Gaudet et al. | |
| 5,886,901 A | 3/1999 | Magoshi | |
| 6,412,098 B1 | 6/2002 | Jin | |
| 6,853,212 B2 * | 2/2005 | Chandar ........ | H03K 3/012 326/16 |
| 6,895,540 B2 | 5/2005 | Chen et al. | |
| 7,146,549 B2 * | 12/2006 | Kanba ........... | G01R 31/318541 714/726 |
| 7,278,126 B2 | 10/2007 | Sun et al. | |

(Continued)

FOREIGN PATENT DOCUMENTS

WO  9931587 A1  6/1999

OTHER PUBLICATIONS

Duckhwan, Kim: "Integrated Design Flow for Pulsed Latch ASIC Circuits", Korea Advanced Institute of Science and Technology, Department of Electrical Engineering, 2012, pp. 23 and 29, chapter 5, paragraph 2.

(Continued)

*Primary Examiner* — Esaw T Abraham
(74) *Attorney, Agent, or Firm* — Patterson + Sheridan, LLP

(57) ABSTRACT

Embodiments herein describe the design of a scan cell within an integrated circuit. The scan cell comprises a memory element, e.g., a flip-flop, and a plurality of output buffer stages. The scan cell also comprises selection logic, e.g., a plurality of transistors. The selection logic selectively activates and deactivates one or more of the plurality of output buffer stages in response to a scan enable signal to change an output latency of the scan cell. The scan cell operates in either a test mode or a normal functional mode according to the scan enable signal. The output latency of the scan cell is changed to mitigate or prevent hold violations.

20 Claims, 9 Drawing Sheets

(56) References Cited

U.S. PATENT DOCUMENTS

| | | | |
|---|---|---|---|
| 7,313,743 B2 * | 12/2007 | Wang | G01R 31/31858 714/726 |
| 7,649,395 B2 * | 1/2010 | Ahmadi | G01R 31/318536 327/202 |
| 7,994,823 B2 | 8/2011 | Lee et al. | |
| 8,316,340 B2 | 11/2012 | Chen | |
| 8,410,787 B2 * | 4/2013 | Waayers | G01R 31/318541 324/537 |
| 8,493,119 B2 | 7/2013 | Leach et al. | |
| 8,639,960 B2 * | 1/2014 | Flynn | G01R 31/318541 713/300 |
| 8,732,499 B2 * | 5/2014 | Flynn | G06F 11/10 713/321 |
| 9,081,061 B1 * | 7/2015 | Agarwal | G01R 31/318541 |
| 9,181,058 B2 * | 11/2015 | Ito | B41J 15/02 |
| 9,196,329 B1 | 11/2015 | Yanni | |
| 9,678,154 B2 * | 6/2017 | Datta | G01R 31/31725 |
| 2003/0214318 A1 * | 11/2003 | Zounes | G01R 31/318541 326/16 |
| 2008/0222471 A1 | 9/2008 | Sul et al. | |
| 2012/0062298 A1 | 3/2012 | Poddutur et al. | |
| 2014/0129887 A1 | 5/2014 | Lin et al. | |
| 2014/0176212 A1 | 6/2014 | Kim | |
| 2014/0189453 A1 | 7/2014 | Gurumurthy | |

OTHER PUBLICATIONS

Ahmadi, Rubil: "A Power Efficient Hold-Friendly Flip-Flop", IEEE, 2008, Sections 3 A and B; 4 and 5.

Luukkainen, Matti: "Verification of Dense Time Properties Using Theories of Untimed Process Algebra", University of Helsinki, Department of Computer Science, pp. 353-368.

* cited by examiner

ADJUSTING LATENCY IN A SCAN CELL

BACKGROUND

The present invention relates to the design of a scan cell, and more specifically, to the design of a scan cell that changes the latency and power consumption in a scan chain based on a scan enable signal.

After an integrated circuit is manufactured, tests are performed on the integrated circuit to detect whether the integrated circuit has manufacturing defects. Testing techniques can detect if functional logic in the integrated circuit have been properly fabricated and function properly. In a typical system on chip, scan based testing such as Automatic Test Pattern Generation (ATPG) and Logic Built in Self Test (LBIST) are commonly used methodologies to detect manufacturing defects in an integrated circuit.

SUMMARY

According to one embodiment of the present invention, a scan cell for testing an integrated circuit comprises a memory element. The memory element comprises a storage element configured to store at least one data bit. The memory element also comprises a plurality of output buffer stages coupled to an output of the storage element and coupled to a common output of the memory element. The memory element further comprises selection logic configured to selectively activate and deactivate one or more of the plurality of output buffer stages in response to a scan enable signal, thereby changing an output latency of the scan cell.

According to another embodiment of the present invention, an integrated circuit comprises a plurality of serially connected scan cells. Each of the scan cells comprises a memory element. The memory element comprises a storage element configured to store at least one data bit. The memory element also comprises a plurality of output buffer stages coupled to an output of the storage element and coupled to a common output of the memory element. The memory element further comprises selection logic configured to selectively activate and deactivate one or more of the plurality of output buffer stages in response to a scan enable signal, thereby changing an output latency of the scan cell.

According to another embodiment of the present invention, a method comprises receiving a scan enable signal at a scan cell. The method also comprises selectively activating and deactivating one or more of a plurality of output buffer stages within the scan cell in response to the scan enable signal, thereby changing an output latency of the scan cell. The plurality of output buffer stages are coupled to an output of a storage element within the scan cell and coupled to a common output of the scan cell.

DETAILED DESCRIPTION

Figure 1A:
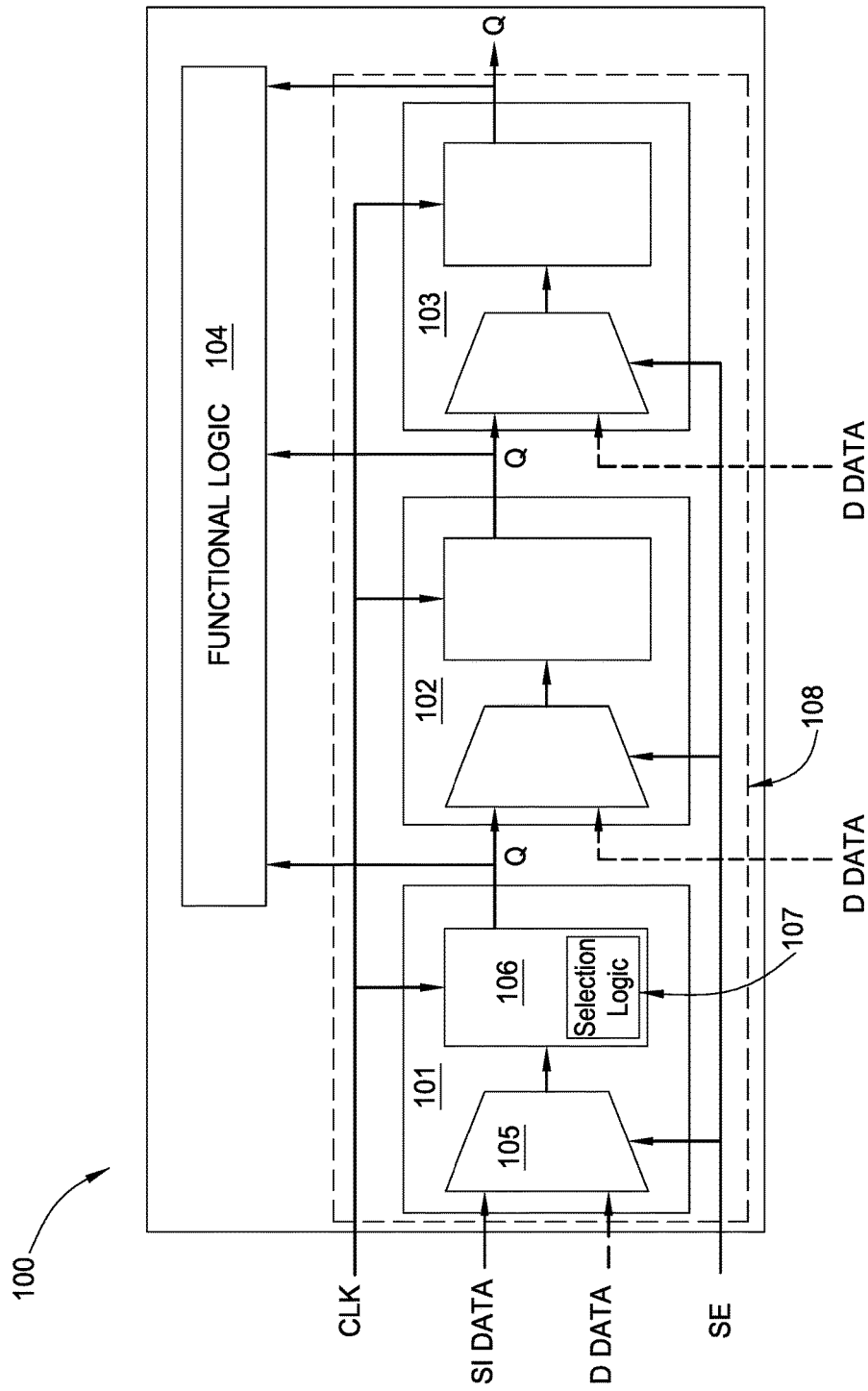
FIG. 1A is a block diagram that shows a scan chain within an integrated circuit according to an embodiment described herein.

A multiplex (MUX) based scan cell is a circuit architecture for testing an integrated circuit using ATPG or LBIST. A MUX based scan cell may operate in either a test mode or a normal functional mode according to a scan enable signal (SE). A MUX based scan cell includes a multiplexer that selects the input data to the scan cell according to the SE signal. The MUX based scan cell operates in the test mode when the multiplexer selects the scan input (SI) data to perform testing. The MUX based scan cell operates in the normal functional mode when the multiplexer selects the normal functional input (D) data to perform normal functions.

A MUX based scan cell also includes a memory element, e.g., a flip-flop, coupled to the multiplexer. The flip-flop captures and stores the data outputted by the multiplexer according to a clock signal (CLK). In one embodiment, the flip-flop captures and stores the data when the rising (or falling) edge of the CLK signal arrives. In the test mode, the output data of the MUX based scan cell can be used to verify whether the functional logic in the integrated circuit have manufacturing defects.

When testing an integrated circuit, multiple MUX based scan cells may be serially connected to form a scan chain to test multiple logic gates of the functional logic in the integrated circuit. In a scan chain, when operating in the test mode, the output data from the previous MUX based scan cell is the SI data of the next MUX based scan cell. When operating in the normal functional mode, the output data from the previous MUX based scan cell is the D data of the next MUX based scan cell.

One problem of using a scan chain is that hold violations may be introduced into the scan chain. In a scan cell of the scan chain, the flip-flop of the scan cell works correctly to capture and store the input data if the input data does not change for a hold time period after the arrival of the rising (or falling) edge of the CLK signal. If the input data is changed, e.g., from 0 to 1, during the hold time period after the arrival of the rising (or falling) edge of the CLK signal, a hold violation occurs. When a hold violation happens, the flip-flop may not capture and store the correct input data. Generally, a hold violation happens when the input signal arrives at the flip-flop earlier than the rising (or falling) edge of the CLK signal and has changed to the next data bit before the hold time period has expired.

In a scan chain, hold violations may be introduced due to clock skew of the CLK signal and/or short path delays in the scan chain. In a scan chain, hold violations may be more frequent when the scan cells operate in the test mode than when operating in the normal functional mode. This is because when the scan cells operate in the test mode, the path delay in the scan chain may be shorter than when the scan cells operate in the normal functional mode. Thus, when the scan cells operate in the test mode, the SI data may arrive at the flip-flop earlier than the rising (or falling) edge of the CLK signal, which can cause hold violations where the wrong data is captured by the flip-flop. Thus, incorrect SI data may be used to test manufacturing defects of the integrated circuit.

One way to fix hold violations is to introduce additional latency into the scan chain. By introducing additional latency into the scan chain, the arrival of the input data at a flip flop can be delayed so that the input signal will not arrive too soon at the flip. Thus, hold violations can be fixed or avoided. Some techniques for fixing hold violations include adding lock-up latches and/or hold delay buffers and/or repeater padding on the scan shift path to introduce additional latencies. The scan shift path is the path from the output of the previous scan cell to the scan input of the next scan cell. By introducing additional latencies on the scan shift path, the SI data from the output of the previous scan cell can be delayed to arrive at the flip flop of the next scan cell.

Although adding latches, buffer, or repeater padding between the scan cells can fix hold violations, these circuits add additional elements on the scan shift path in the scan chain which increases the chip area, active power consumption, and leakage power. Moreover, an integrated circuit is primarily used in the normal functional mode especially after manufacturing tests. The scan shift path is sparingly used and is typically of no use in the normal functional mode. Thus, adding additional delay elements on the scan shift path is not economical.

Therefore, it would be advantageous to design a MUX based scan cell that can fix hold violations in a scan chain without adding additional elements on the scan shift path in the scan chain.

In one embodiment of the present invention, the storage element of the scan cell includes selection logic that changes an output latency of the scan cell. In another embodiment of the present invention, the multiplexer of the scan cell includes delay logic. The delay logic changes a scan latency of the scan cell.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

With reference now to FIG. 1A, FIG. 1A shows a scan chain within an integrated circuit according to one embodiment described herein. In FIG. 1A, the integrated circuit 100 includes functional logic 104 and a scan chain 108. The scan chain 108 includes three MUX based scan cells 101, 102 and 103. In other embodiments, the scan chain 108 may include a different number of scan cells.

In FIG. 1A, each of the scan cells 101, 102 and 103 includes a multiplexer 105 and a memory element 106. For simplicity of illustration, the labels 105 and 106 are only shown in the scan cell 101 in FIG. 1A. In the scan chain 108, the multiplexers 105 in each of the scan cells are controlled by the same SE signal. Also, the memory elements 106 in each of the scan cells are controlled by the same CLK signal. Either SI data or D data is selected by the multiplexer 105 in each of the scan cells 101, 102 and 103 according to the SE signal. For example, when SE is high, e.g., SE=1, the multiplexer 105 outputs the SI data to perform testing. When SE is low, e.g., SE=0, the multiplexer 105 outputs the D data to perform normal functions.

In each scan cell of the scan chain 108, the selected input data is output from the multiplexer 105 and sent to the memory element 106. The memory element 106 captures and stores the selected input data. In the scan chain 108, when the scan cells operate in the test mode the output data Q from the memory element 106 of one scan cell is the input data to the multiplexer 105 of the next scan cell. For example, the output data Q from the memory element 106 of the scan cell 101 is the input data to the multiplexer 105 of the scan cell 102. When the scan cells operate in the test mode, the output data Q from the memory element 106 of one scan cell is the SI data to the multiplexer 105 of the next scan cell. In the test mode, the output data Q from each scan cell is the correctly captured SI data when there is no hold violation. Thus, the output data Q from each scan cell, i.e., the SI data, can be used to test the functional logic 104. When the scan cells operate in the normal functional mode, D data is selected by the multiplexers 105 of each scan cell to perform normal functions. In the normal functional mode, D data is stored in the memory element before being forwarded to the functional logic to perform normal functions.

In this embodiment, the memory element 106 in each scan cell includes selection logic 107. For simplicity of illustration, the selection logic 107 is only shown in the scan cell 101 in FIG. 1A. The selection logic 107 can change the output latency of the corresponding scan cell. For example, in the test mode, the selection logic 107 can increase the output latency of the corresponding scan cell, so that hold violations within in the scan chain 108 can be fixed. The memory element 106 and the selection logic 107 will be described in details below.

Figure 1B:
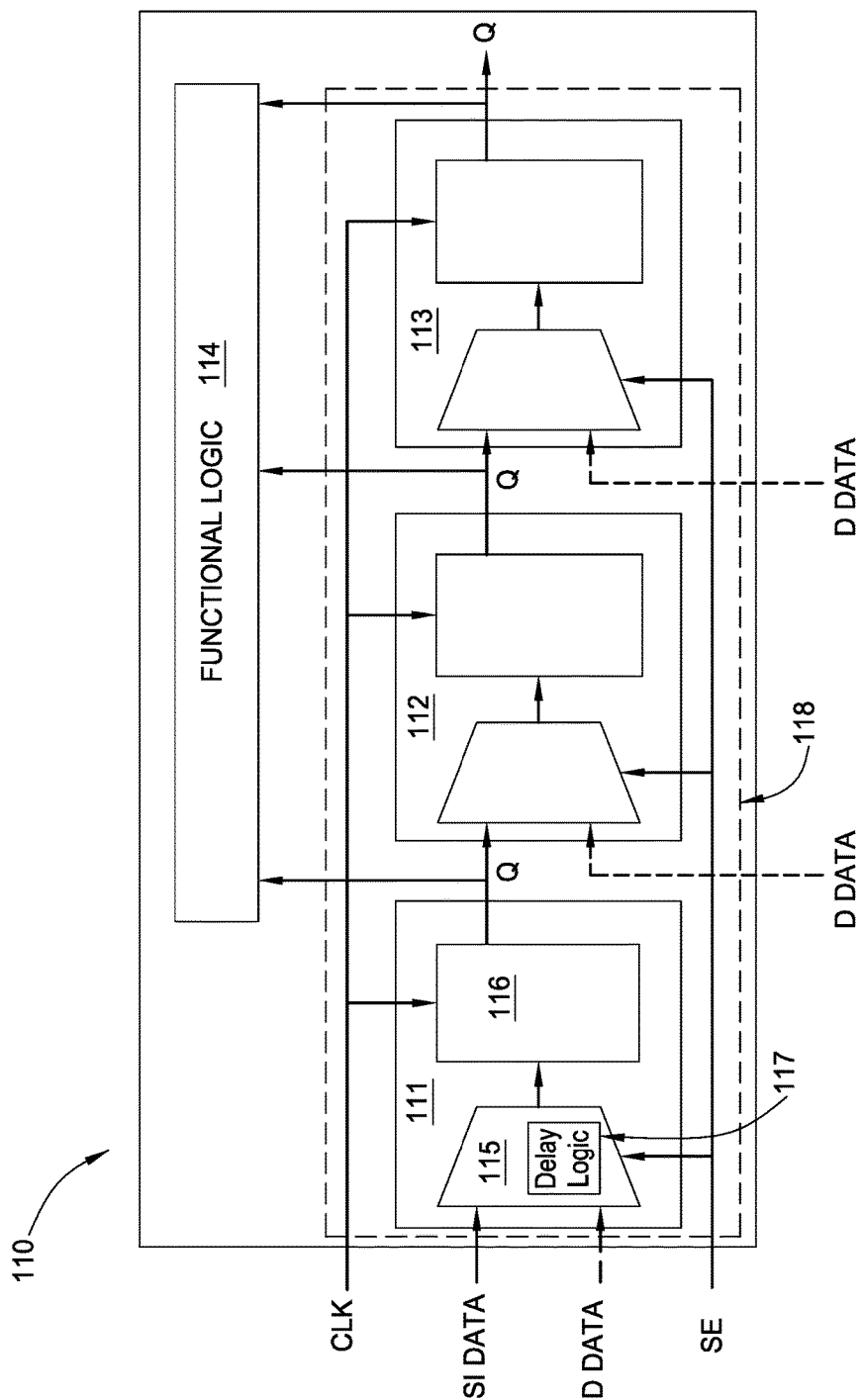
FIG. 1B is a block diagram that shows a scan chain within an integrated circuit according to an embodiment described herein.

FIG. 1B shows a scan chain within an integrated circuit according to one embodiment. In FIG. 1B, the integrated circuit 110 includes a functional logic 114 and a scan chain 118. The scan chain 118 includes three MUX based scan cells 111, 112 and 113. In other embodiments, the scan chain 118 may include a different number of scan cells.

In FIG. 1B, each of the scan cells 111, 112 and 113 includes a multiplexer 115 and a memory element 116. For simplicity of illustration, the labels 115 and 116 are shown only in the scan cell 111 in FIG. 1B. Similarly as in FIG. 1A, in the scan chain 118, the multiplexers 115 in each of the scan cells are controlled by the same SE signal. Also, the memory elements 116 in each of the scan cells are controlled by the same CLK signal. Either SI data or D data is selected by the multiplexer 115 of the scan cell 111 according to the SE signal.

As in FIG. 1A, in each scan cell of the scan chain 118, the selected data is output from the multiplexer 115 and sent to the memory element 116. The memory element 116 captures and stores the selected input data. In the scan chain 118, the output data Q from the memory element 116 of one scan cell is the input data to the multiplexer 115 of the next scan cell. For example, the output data Q from the memory element 116 of the scan cell 111 is the input data to the multiplexer 115 of the scan cell 112. When the scan cells operate in the test mode, the output data Q from the memory element 116 of one scan cell is the SI data to the multiplexer 115 of the next scan cell. In the test mode, the output data Q from each scan cell is the correctly captured SI data when there is no hold violation. Thus, the output data Q from each scan cell, i.e., the SI data, can be used to test the functional logic 114.

In this embodiment, the multiplexer 115 in each scan cell includes delay logic 117. For simplicity of illustration, the delay logic 117 is only shown in the scan cell 111 in FIG. 1B. The delay logic 117 can change the scan latency of the corresponding scan cell. For example, in the test mode, the delay logic 117 can increase the scan latency of the corresponding scan cell, so that hold violations within in the scan chain 118 can be fixed. The multiplexer 115 and the delay logic 117 will be described in details below.

Figure 2:
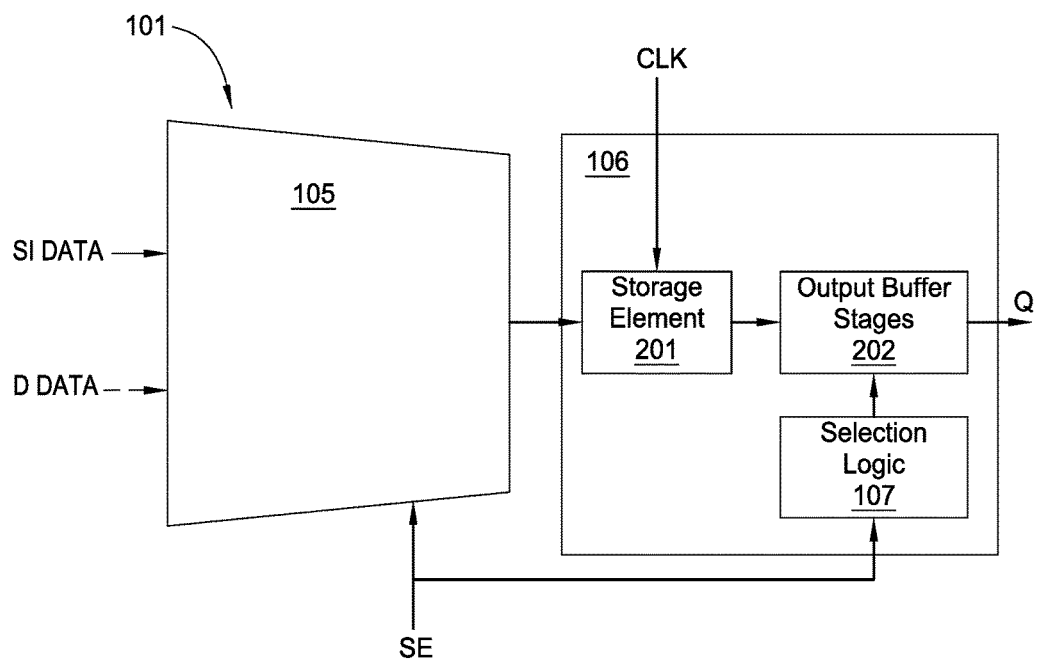
FIG. 2 is a block diagram that shows a scan cell of FIG. 1A according to one embodiment described herein.

FIG. 2 is a block diagram that shows a scan cell 101 of FIG. 1A. In FIG. 2, the scan cell 101 includes the multiplexer 105 and the memory element 106 as described in FIG. 1A. Either SI data or D data is selected by the multiplexer 105 of the scan cell 101 according to the SE signal. The selected data is output from the multiplexer 105 and sent to the memory element 106.

In FIG. 2, the memory element 106 includes a storage element 201, a plurality of output buffer stages 202 and the selection logic 107. The storage element 201 stores at least one data bit such as one SI data bit or one D data bit. The storage element 201 can be a flip-flop or any other single bit storage element as understood by an ordinary person in the art. The plurality of output buffer stages 202 are coupled to an output of the storage element 201 and coupled to a common output Q of the memory element 106. The plurality of output buffer stages 202 provide drive current for outputting the data bit stored in the memory element 106.

The selection logic 107 selectively activates and deactivates one or more of the plurality of output buffer stages 202 in response to the SE signal to change an output latency of the scan cell 101. For example, when the scan cell 101 operates in the test mode according to the SE signal, the selection logic 107 deactivates one or more of the plurality of output buffer stages 202. Thus, the output latency within the output buffer stages 202 is increased to mitigate hold violations. In one embodiment, when the scan cell 101 operates in the normal functional mode according to the SE signal, the selection logic 107 activates all of the plurality of output buffer stages 202. Thus, the scan cell 101 operates in the normal functional mode with less output latency. Put differently, during the test mode, the selection logic 107 activates fewer of the buffer stages 202 than when in the normal functional mode. As a result, the output Q has more latency when driving the SI data than when driving the D data. An exemplary embodiment of the selection logic 107 will be described in details below.

Figure 3:
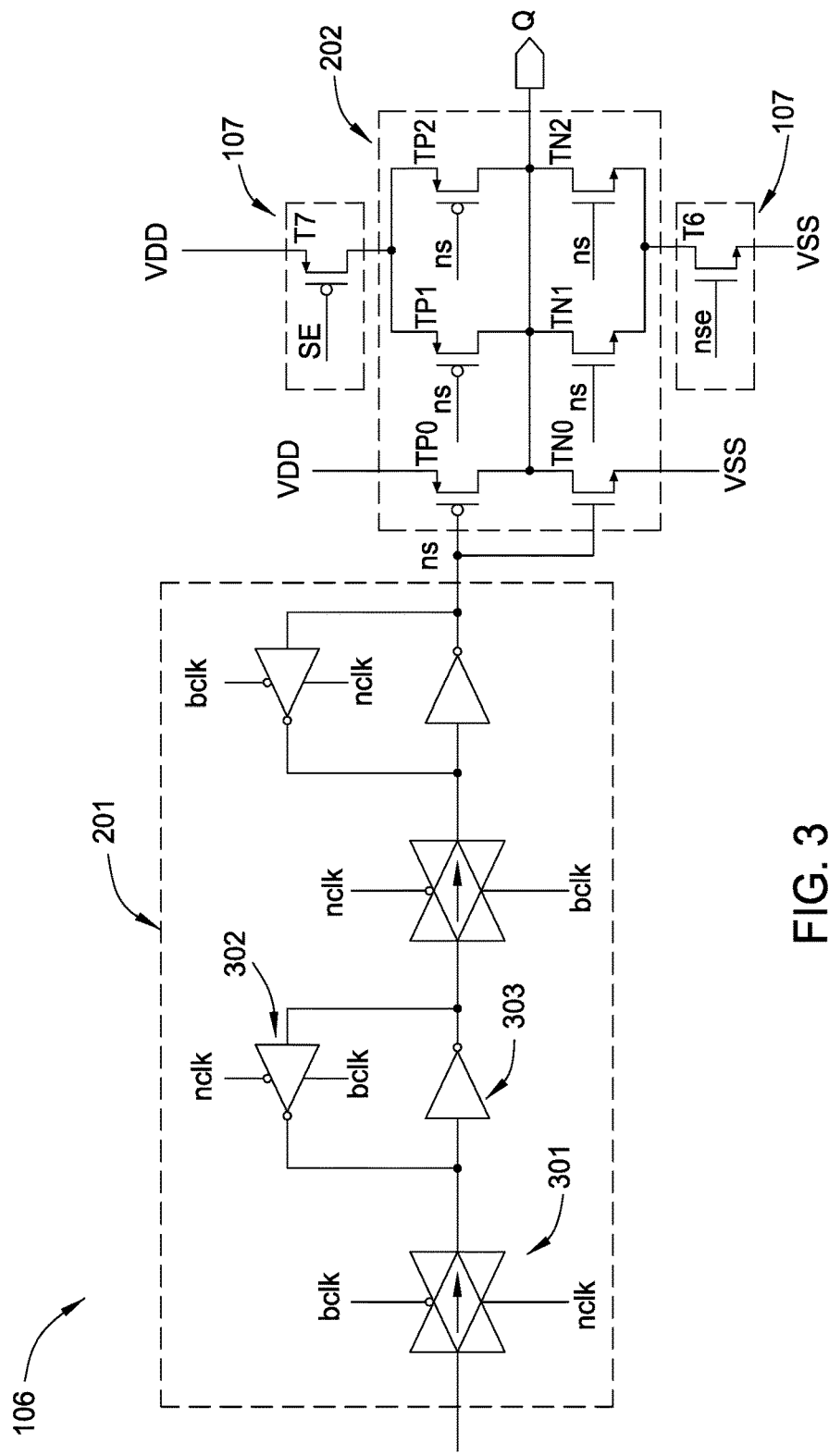
FIG. 3 is a circuit diagram that shows a memory element within a scan cell of FIG. 1A according to one embodiment described herein.

FIG. 3 is a circuit diagram that shows a memory element 106 of FIG. 1A. As shown in FIG. 3, the memory element 106 includes the storage element 201 which is a flip-flop in this embodiment. The flip on the left part of the storage element 201 includes a transmission gate 301 and two inverters 302 and 303. The flop on the right part of the storage element 201 has a similar structure. The flip-flop is controlled by the CLK signal and works to capture and store input data when the rising (or falling) edge of the CLK signal arrives, as understood by an ordinary person in the art.

The memory element 106 also includes three output buffer stages 202. The three output buffer stages 202 are coupled to an output, denoted as ns, of the storage element 201 and coupled to the common output Q of the memory element 106. Each output buffer stage includes a pair of Field Effect Transistors (FETs). Each pair of FETs includes a P-channel FET (PFET) and an N-channel FET (NFET). As shown in FIG. 3, the first output buffer stage includes PFET TP0 and NFET TN0, the second output buffer stage includes PFET TP1 and NFET TN1, and the third output buffer stage includes PFET TP2 and NFET TN2.

The memory element 106 also includes selection logic 107. In one embodiment, the selection logic 107 includes a pair of transistors PFET T7 and NFET T6. The selection logic 107 is coupled to the second and the third output buffer stages. Specifically, the source of T7 of the selection logic 107 is coupled to the drain of TP1 and the drain of TP2, and the drain of T6 of the selection logic 107 is coupled to the source of TN1 and the source of TN2. T7 and T6 selectively activate and deactivate the second and the third output buffer stages according to the SE signal, as described in detail below. In the example as shown in FIG. 3, the first output buffer stage (TP0/TN0) is not coupled to the selection logic 107. Thus, the first output buffer stage (TP0/TN0) is not controlled by the selection logic 107.

As shown in FIG. 3, SE signal is coupled to the gate of PFET T7 and nse (not SE) signal is coupled to the gate of NFET T6. When SE is low, e.g., SE=0, the scan cell operates in the normal functional mode. In the normal functional mode, the low SE signal is applied to the gate of PFET T7 and the high nse signal is applied to the gate of NFET T6, thus T7 and T6 are both ON. Therefore, the second and third output buffers formed by TP1, TN1, TP2, and TN2 are coupled to the reference voltages VDD and VSS thereby activating these output buffers. The drive current can flow through the second output buffer stage TP1/TN1 and the third output buffer stage TP2/TN2 from a high voltage VDD to a low voltage VSS. In other words, when T7 and T6 are ON, the second output buffer stage TP1/TN1 and the third output buffer stage TP2/TN2 are activated such that they drive the output Q. Note that, in the normal functional mode, the first output buffer stage (TP0/TN0) is also ON because it is not controlled by the selection logic 107.

On the other hand, when SE is high, e.g., SE=1, the scan cell operates in the test mode. In the test mode, the high SE signal is applied to the gate of PFET T7 and the low nse signal is applied to the gate of NFET T6, thus T7 and T6 are both OFF. Therefore, the drive current cannot flow through the second output buffer stage TP1/TN1 and the third output buffer stage TP2/TN2 from VDD to VSS. In other words, when T7 and T6 are OFF, the second output buffer stage TP1/TN1 and the third output buffer stage TP2/TN2 are deactivated such that drive current cannot flow through them. Note that, in the test mode, the first output buffer stage (TP0/TN0) is still ON because it is not controlled by the selection logic 107, and is the only output buffer stage driving the output Q.

Therefore, when the scan cell operates in the normal functional mode, i.e., SE is low, the drive current can flow through all the three parallel output buffer stages to provide a higher drive current. This higher drive current causes less output latency. On the other hand, when the scan cell operates in the test mode, i.e., SE is high, the drive current can only flow through the first output buffer stage TP0/TN0 to provide a lower drive current. This lower drive current increases the output latency of the scan cell. Thus, when the scan cell operates in the test mode, the increased output latency of the scan cell can be used to fix or avoid hold violations. In one embodiment, the output latency of the scan cell is a latency on a path between the output of the storage element ns and the common output Q of the memory element.

FIG. 3 is only an exemplary illustration of one embodiment of the present invention. In other embodiments, the storage element 201 may be any single bit storage element as understood by an ordinary person in the art. In other embodiments, the memory element 106 may include a different number of output buffer stages 202. In other embodiments, the selection logic 107 may include a different number of transistors. The selection logic 107 may be coupled to a different number of output buffer stages 202. Also, the selection logic 107 may activate or deactivate a different number of output buffer stages 202.

Figure 4:
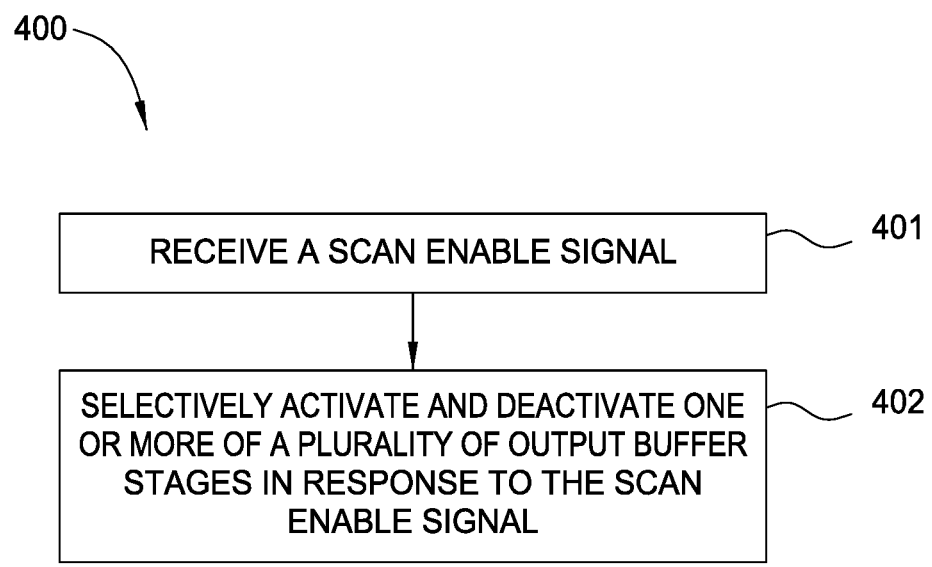
FIG. 4 is a flowchart that illustrates a method of changing a latency within a scan cell according to one embodiment described herein.

FIG. 4 is a flowchart that illustrates a method 400 of changing a latency within the scan cell according to one embodiment. Method 400 can be performed by a scan cell. At block 401, the scan cell receives a SE signal. At block 402, the scan cell selectively activates and deactivates one or more of a plurality of output buffer stages within the scan cell in response to the SE signal, thereby changing an output latency of the scan cell. For example, when SE is low, e.g., SE=0, the scan cell activates a plurality of output buffer stages within the scan cell, thereby reducing an output latency of the scan cell. When SE is high, e.g., SE=1, the scan cell deactivates at least one of the plurality of output buffer stages within the scan cell, thereby increasing an output latency of the scan cell. The deactivation of one or more output buffer stages can also save power consumption.

Figure 5:
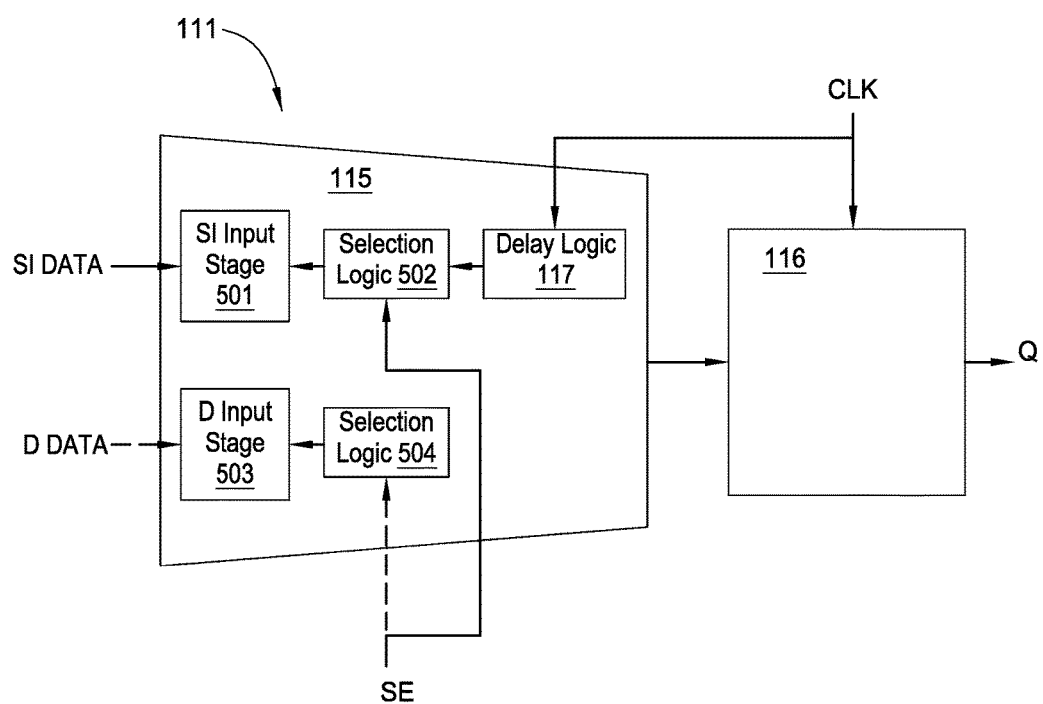
FIG. 5 is a block diagram that shows a scan cell of FIG. 1B according to one embodiment described herein.

FIG. 5 is a block diagram that shows a scan cell 111 of FIG. 1B. In FIG. 5, the scan cell 111 includes the multiplexer 115 and the memory element 116 as described in FIG. 1B. The multiplexer 115 includes an SI input stage 501 that receives SI data. The SI input stage 501 is coupled to selection logic 502. The multiplexer 115 includes a D input stage 503 that receives D data. The D input stage 503 is coupled to selection logic 504. The selection logic 502 and 504 select between the SI input stage 501 and the D input stage 503 according to the SE signal. For example, when the scan cell 111 operates in the test mode, i.e., SE is high, the selection logic 502 selects the SI input stage 501 thereby outputting SI data to the memory element 116. Conversely, in the test mode, the selection logic 504 does not select the D input stage 503. When the scan cell 111 operates in the normal functional mode, i.e., SE is low, the selection logic 504 selects the D input stage 503 to receive D input data thereby outputting the D data to the memory element 116 while the selection logic 502 does not select the SI input stage 501.

In this embodiment, the multiplexer 115 includes delay logic 117 controlled by the CLK signal. The delay logic 117 is coupled to the selection logic 502. The delay logic 117 includes a plurality of delay elements (not shown in FIG. 5) which are described in details below. When the scan cell 111 operates in the test mode, i.e., when the selection logic 502 selects the SI input stage 501, the delay logic 117 activates the delay elements to increase a scan latency of the scan cell 111 to mitigate or prevent hold violations. However, when the scan cell 111 operates in the normal functional mode, i.e., when the selection logic 504 selects the D input stage 503, the delay logic 117 does not affect the output of the multiplexer 111. In other words, the delay logic 117 affects the output latency of the multiplexer 111 only when the selection logic 502 selects the SI input stage 501, i.e., in the test mode.

Figure 6:
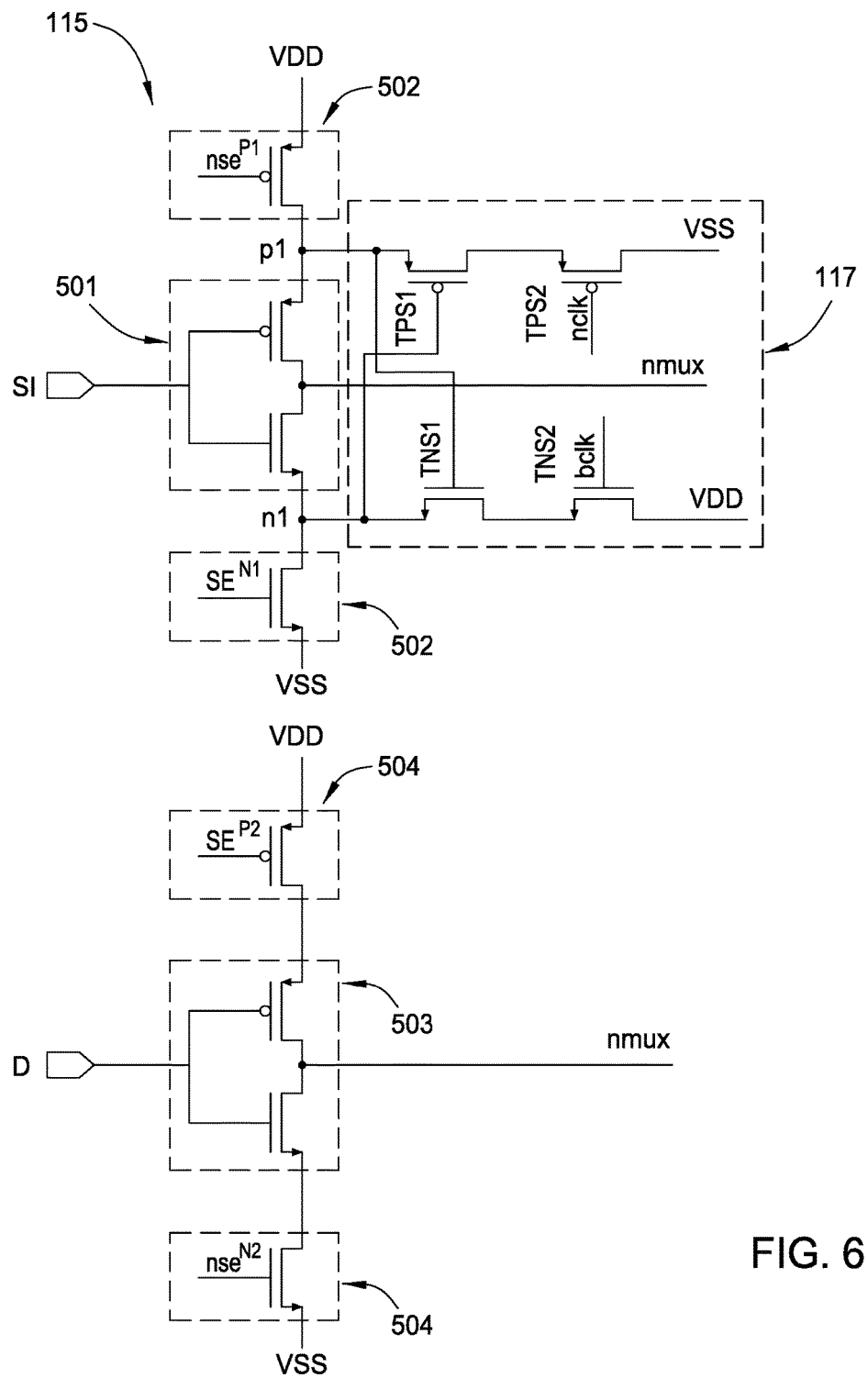
FIG. 6 is a circuit diagram that shows a multiplexer within a scan cell of FIG. 1B according to one embodiment described herein.

FIG. 6 is a circuit diagram that shows a multiplexer 115 of FIG. 1B. As shown in FIG. 6, the multiplexer 115 includes an SI input stage 501 and a D input stage 503. Each of the SI input stage 501 and the D input stage 503 includes a pair of FETs including a PFET and an NFET. The SI input stage 501 is coupled to selection logic 502 which includes a pair of FETs—i.e., PFET P1 and NFET N1. The SE signal is coupled to the gate of N1 and nse signal is coupled to the gate of P1. Similarly, the D input stage 503 is coupled to selection logic 504 which includes a pair of FETs including a PFET P2 and an NFET N2. SE signal is coupled to the gate of the P2 and nse signal is coupled to the gate of the N2.

Figure 7:
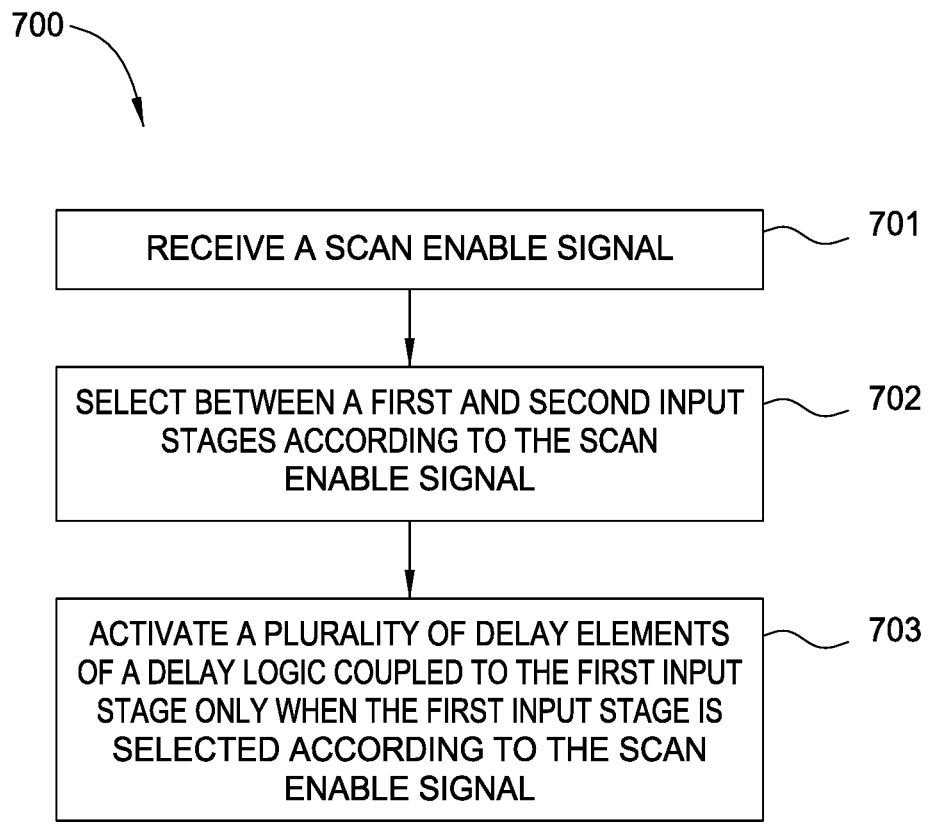
FIG. 7 is a flowchart that illustrates a method of changing a latency within a scan cell according to one embodiment described herein.

The multiplexer 115 also includes delay logic 117 coupled to the SI input stage 501 and coupled to the selection logic 502. The delay logic 117 may include a plurality of delay elements. In this example, the delay logic 117 includes four delay elements. The delay elements may be a plurality of transistors. For example, as shown in FIG. 7, two of the four delay elements are PFETs TPS1 and TPS2. Another two of the four delay elements are NFETs TNS1 and TNS2. The gate of TPS1 is connected to node n1, which is an internal node of the multiplexer 115 connected to P1 of the selection logic 502. The gate of TNS1 is connected to another internal node p1, which is connected to N1 of the selection logic 502. As shown in FIG. 6, TPS1 and TNS1 are coupled to the SI input stage 501 and coupled to the selection logic 502.

TPS2 and TNS2 are controlled by the CLK signal. When the CLK signal is low, e.g., CLK=0, the high nclk (not CLK) signal is applied to the gate of TPS2, thus TPS2 is OFF. The low CLK signal (bclk) is applied to the gate of TNS2, thus TNS2 is also OFF. Therefore, when the CLK signal is low, no current can flow through TPS2 and TNS2 from VDD to VSS. When TPS2 and TNS2 are OFF, the leakage power is at a minimum level to save power consumption.

When SE is high, e.g., SE=1, the high SE signal is applied to the gate of N1 of the selection logic 502 and the low nse signal is applied to the gate of P1 of the selection logic 502, thus P1 and N1 are ON to select the SI input stage. When P1 and N1 are ON, node n1 is pulled to a low voltage close to VSS and node p1 is pulled to a high voltage close to VDD. Since the gate of TPS1 is connected to node n1, when n1 has a low voltage, TPS1 is ON. When the CLK signal is high (e.g., rising edge arrives), e.g., CLK=1, the low nclk signal is applied to the gate of TPS2, thus TPS2 is ON. When TPS1 and TPS2 are both ON, current can flow through TPS1 and TPS2 from VDD to VSS, so that node p1 has a voltage lower than the case that TPS1 and TPS2 are both OFF. Thus, when TPS1 and TPS2 are both ON, node p1 is at a potential lower than VDD, which is determined by the resistance offered by TPS1 and TPS2. Similarly, since the gate of TNS1 is connected to node p1, when p1 has a high voltage, TNS1 is ON. When the CLK signal is high, TNS2 is ON due to the high bclk signal. When TNS1 and TNS2 are both ON, current can flow through TNS1 and TNS2 from VDD to VSS, so that node n1 has a voltage higher than the case that TNS1 and TNS2 are both OFF. Thus, when TNS1 and TNS2 are both ON, node n1 is at a potential higher than VSS, which is determined by the resistance offered by TNS1 and TNS2.

When the potential on nodes p1 and n1 are changed in such a way, the rise and fall transition time on the output path of the SI input stage 501, denoted as nmux, will be delayed as determined by the potential on nodes p1 and n1. The delay of the rise and fall transition on the nmux path increases the latency on the nmux path, thus also increases the output latency of the multiplexer and the overall latency of the scan cell, which can be used to mitigate or prevent hold violations.

On the other hand, when SE is low, e.g., SE=0, P2 and N2 of the selection logic 504 are ON to select the D input stage 503. P1 and N1 of the selection logic 502 are OFF so that the SI input stage 501 is not selected—i.e., the SI input stage 501 is inactive. Thus, when SE is low, e.g., SE=0, the delay logic 117 coupled to the SI input stage 501 does not affect nmux. In other words, the delay logic 117 activate the delay elements only when the selection logic 502 selects the SI input stage 501 to receive SI input data, i.e., in the test mode.

FIG. 7 is a flowchart that illustrates a method 700 of changing a latency within the scan cell according to one embodiment. Method 700 can be performed by a scan cell. At block 701, the scan cell receives a SE signal. At block 702, the scan cell selects between first and second input stages within the scan cell according to the SE signal. For example, when SE is high, e.g., SE=1, the scan cell selects the first input stage, i.e., the SI input stage to output SI data from the multiplexer. When SE is low, e.g., SE=0, the scan cell selects the second input stage, i.e., the D input stage to output D data from the multiplexer. At block 703, the scan cell activates a plurality of delay elements of a delay logic coupled to the first input stage only when the first input stage is selected according to the SE signal, thereby changing a scan latency of the scan cell. For example, the scan cell activates a plurality of delay elements of a delay logic coupled to the SI input stage only when the SI input stage is selected, i.e., SE is high, thereby increasing a scan latency of the scan cell.

With the present invention, the additional logic is implemented inside of a MUX based scan cell or any other scan cell as known in the art. Thus, the latency is changed within the scan cell. Therefore, the present invention avoids the need of adding additional elements on the scan shift path in the scan chain between two scan cells. This helps to avoid a lot of delay or repeater cells on the scan shift path which accounts for die area, active and leakage power and timing closure convergence. Thus, the present invention not only can fix hold violations, but also can save power consumption. Moreover, the latency can be added to the multiplexer stage of the scan cell or to the output buffer stages of the scan cell or a combination of both. This gives the designer granularity in adding the amount of latency needed to fix hold violations.

Figure 8:
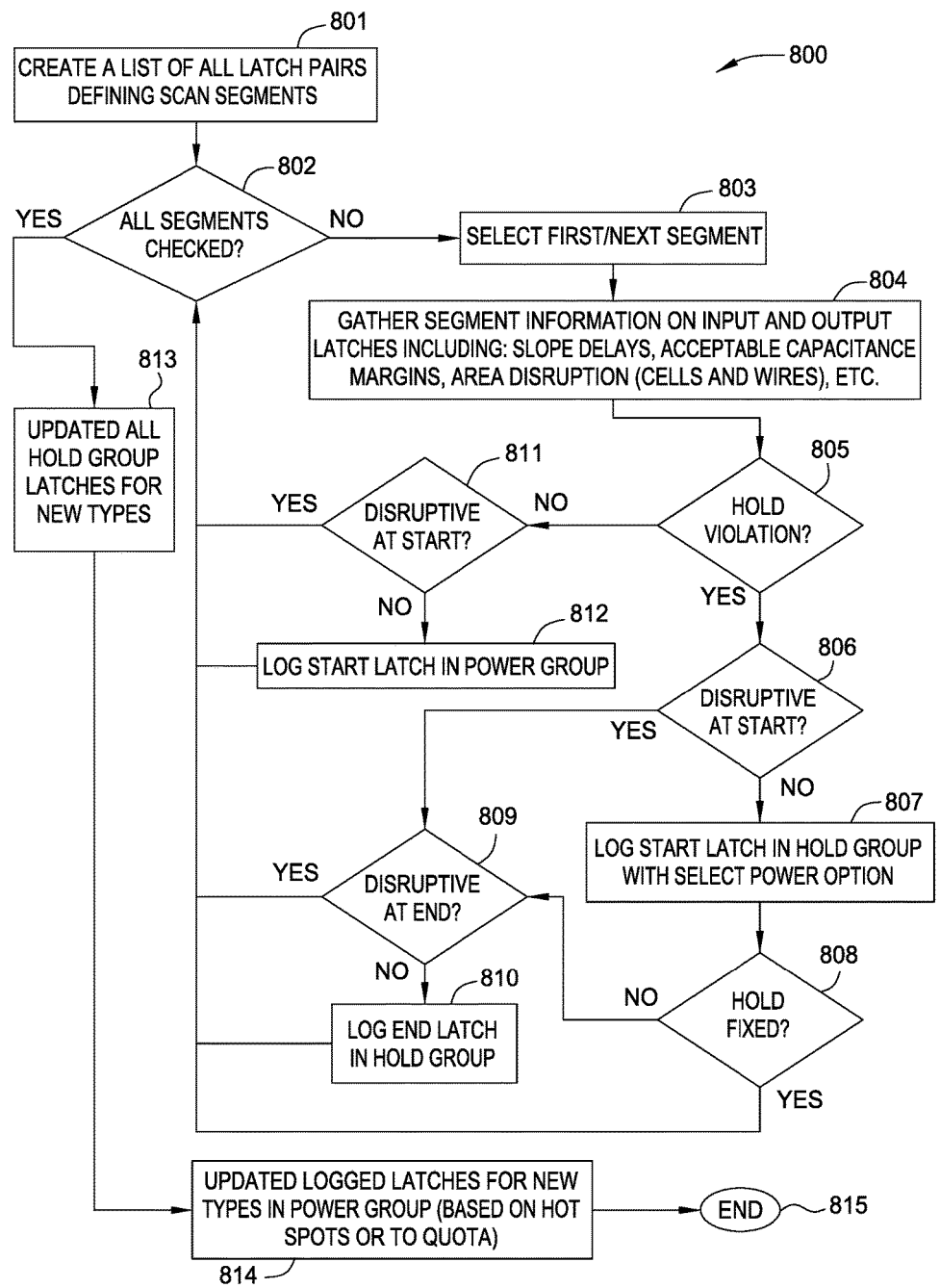
FIG. 8 is a flowchart that illustrates a process for fixing hold violations or saving power consumption for a plurality of scan segments according to one embodiment described herein.

FIG. 8 is a flowchart that illustrates a process 800 for fixing hold violations or saving power consumption for a plurality of scan segments according to one embodiment described herein. In one embodiment, a scan chain may include a plurality of smaller scan segments. Each scan segment may be defined by a pair of latches or flip flops, i.e., a latch at the start of the scan segment and a latch at the end of the scan segment. Each scan segment may include a pair of conventional latches when there is no hold violation. With the present invention, when designing the scan segments (e.g., when designing or simulating an integrated circuit containing the scan segments), one or both of the two conventional latches can be replaced by new types of latches according to the present invention to fix expected or simulated hold violations or save power consumption.

According to one embodiment, at step 801 when designing the scan segments, a list is created including all latch pairs defining the plurality of scan segments. Step 802 checks whether all the scan segments are processed. If not, the first or the next scan segment is selected at step 803. Segment information of the pair of latches defining the selected scan segment is gathered at step 804. The segment information includes various design factors which can include but not limited to functional sharing of scan output, wiring, area, power, slope delays, acceptable capacitance margins. The gathered segment information will be used to determine whether there is disruptive effect to the various design factors when replacing one or both of the two conventional latches. For example, in an area with a tight wiring, even adding a slightly bigger latch would cause a disruptive effect. Step 805 checks whether there is expected or simulated hold violation in the selected scan segment. If yes, the process goes to step 806 to check whether there is disruptive effect at the start of the scan segment. If not, the process goes to step 807 to log the latch at the start of the scan segment in a hold group. The latch at the start of the scan segment may be replaced by a new type of latch with the selection logic 107 in the memory element 106 as described in FIGS. 2 and 3 to fix the expected or simulated hold violations. Put differently, the designer or design tool can selectively replace generic latches (i.e., latches without varying delays) with the latches described above to solve hold violations in timing simulations.

Step 808 checks whether the expected or simulated hold violation can be fixed by replacing the latch at the start of the scan segment. If yes, the process goes back to 802. If not, the process goes to step 809 to check whether there is disruptive effect at the end of the scan segment. If not, the process goes to step 810 to log the latch at the end of the scan segment in the hold group. The latch at the end of the scan segment may be replaced by another new type of latch with the delay logic 117 in the multiplexer 115 as described in FIGS. 5 and 6 to fix the expected or simulated hold violations. In this scenario, the latch at the start of the scan segment is replaced by the new type of latch as described herein (e.g., memory element 106) to introduce output latency, and the latch at the end of the scan segment is replaced by the other new type of latch (which includes multiplexer 115) to introduce scan input latency. Thus, serious hold violations can be fixed by introducing latency at both the output side of the latch at the start of the scan segment and the input side of the latch at the end of the scan segment. After step 810, the process goes back to 802. However, if step 809 determines that there is disruptive effect at the end of the scan segment, the latch at the end of the scan segment may not be replaced due to disruptive effect to the various design factors. Then the process goes back to 802 without fixing the serious hold violations due to disruptive effect at the end of the scan segment. In this situation, introducing additional buffers or repeaters may be used to fix the expected or simulated hold violations.

On the other hand, if step 806 determines that there is disruptive effect at the start of the scan segment, the latch at the start of the scan segment may not be replaced due to disruptive effect to the various design factors. Then the process goes to step 809 to check whether there is disruptive effect at the end of the scan segment. If still yes at step 809, the latch at the end of the scan segment may not be replaced due to disruptive effect to the various design factors. Then the process goes back to 802 without fixing the expected or simulated hold violations due to disruptive effect at both the start and the end of the scan segment. In this situation, separate buffers or repeaters may be added to the scan segment to fix the expected or simulated hold violations. If step 809 determines that there is no disruptive effect at the end of the scan segment, the process goes to step 810 to log the latch at the end of the scan segment in the hold group. The latch at the end of the scan segment may be replaced by the new type of latch with the delay logic 117 in the multiplexer 115 as described in FIGS. 5 and 6 to fix the expected or simulated hold violations. In this situation, only the latch at the end of the scan is replaced to fix the expected or simulated hold violations.

Even when there is no hold violation in the scan segment, the latch at the start of the scan segment may provide power saving benefits by replacing it with the new type of latch with the selection logic 107 in the memory element 106 as described in FIGS. 2 and 3. Thus, if step 805 determines that there is not hold violation. The process may go to step 811 to check whether there is disruptive effect at the start of the scan segment. If not, the process goes to step 812 to log the latch at the start of the scan segment in a power group to provide potential power saving benefits. When all the segments are processed, the process goes to step 813 to replace all latches logged in the hold group with the new types of latches to fix the expected or simulated hold violations. At step 814, the latches logged in the power group may also be replaced to save power consumption based on power needs. The process is finished at step 815.

As described in FIG. 8, the latency may be added to the output side, e.g., the output buffer stages, of the latch at the start of the scan segment. The latency may be added to the input side, e.g., the multiplexer stage, of the latch at the end of the scan segment. Also, the latency may be added to both of the latches at the start and at the end of the scan segment depending on various other design factors. When adding the latency at the two latches is not disruptive to those design factors, the change at the output side of the latch at the start of the scan segment is typically preferred as it has power and area savings advantages over the change at the input side of the latch at the end of the scan segment.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing is directed to embodiments of the present invention, other and further embodiments of the invention may be devised without departing from the basic scope thereof, and the scope thereof is determined by the claims that follow.

What is claimed is:

1. An integrated circuit, comprising:
   a plurality of serially connected scan cells for testing the integrated circuit, wherein each of the scan cells comprises a memory element, and wherein the memory element comprises:
      a storage element configured to store at least one data bit;
      a plurality of output buffer stages, wherein each output buffer stage of the plurality of output buffer stages receives input from a shared input node coupled to an output of the storage element and outputs to a shared output node of the memory element; and
      selection logic configured to selectively activate and deactivate one or more output buffer stages of the plurality of output buffer stages in response to a scan enable signal, thereby changing an output latency of the corresponding scan cell, wherein the scan enable signal changes the scan cell between a test mode and a normal functioning mode, wherein both the test mode and the normal functioning mode output via the shared output node.

2. The integrated circuit of claim 1, wherein the selection logic comprises a first switch selectively coupling the output buffer stages to a high voltage rail and a second switch selectively coupling the output buffer stages to a low voltage rail.

3. The integrated circuit of claim 2, wherein the selection logic is configured to deactivate the one or more output buffer stages of the plurality of output buffer stages when the scan enable signal places the scan cell in the test mode.

4. The integrated circuit of claim 1, wherein the selection logic is configured to deactivate the one or more output buffer stages of the plurality of output buffer stages such that no drive current flows through the deactivated one or more output buffer stages, thereby increasing the output latency of the scan cell.

5. The integrated circuit of claim 1, wherein at least one output buffer stage of the plurality of output buffer stages is not controlled by the selection logic.

6. The integrated circuit of claim 5, wherein the uncontrolled output buffer stage is configured to provide drive current to the common output of the memory element in both the test mode and the normal functioning mode.

7. The integrated circuit of claim 1, wherein the output latency of the scan cell comprises a latency on a path between the output of the storage element and the common output of the memory element.

8. A memory element within a scan cell for testing an integrated circuit, comprising:
   a storage element configured to store at least one data bit;
   a plurality of output buffer stages, wherein each output buffer stage of the plurality of output buffer stages received input from a shared input node coupled to an output of the storage element and outputs to a shared output node of the memory element; and
   selection logic configured to selectively activate and deactivate one or more output buffer stages of the plurality of output buffer stages in response to a scan enable signal, thereby changing an output latency of the scan cell, wherein the scan enable signal changes the scan cell between a test mode and a normal functioning mode wherein both the test mode and the normal functioning mode output via the shared output node.

9. The memory element of claim 8, wherein the selection logic comprises a first switch selectively coupling the output buffer stages to a high voltage rail and a second switch selectively coupling the output buffer stages to a low voltage rail.

10. The memory element of claim 9, wherein the selection logic is configured to deactivate the one or more output buffer stages of the plurality of output buffer stages when the scan enable signal places the scan cell in the test mode.

11. The memory element of claim 8, wherein the selection logic is configured to deactivate the one or more output buffer stages of the plurality of output buffer stages such that no drive current flows through the deactivated one or more output buffer stages, thereby increasing the output latency of the scan cell.

12. The memory element of claim 8, wherein at least one output buffer stage of the plurality of output buffer stages is not controlled by the selection logic.

13. The memory element of claim 12, wherein the uncontrolled output buffer stage is configured to provide drive current to the common output of the memory element in both the test mode and the normal functioning mode.

14. The memory element of claim 8, wherein the output latency of the scan cell comprises a latency on a path between the output of the storage element and the common output of the memory element.

15. A method, comprising:
receiving a scan enable signal at a scan cell in an integrated circuit, wherein the scan enable signal changes the scan cell between a test mode and a normal functioning mode;
selectively activating and deactivating one or more output buffer stages of a plurality of output buffer stages within the scan cell in response to the scan enable signal, thereby changing an output latency of the scan cell, wherein each output buffer stage of the plurality of output buffer stages receives input from a shared input node coupled to an output of a storage element within the scan cell and outputs to a shared output node of the scan cell via which the scan cell provides output in both the test mode and the normal functioning mode.

16. The method of claim 15, further comprising selectively coupling a first switch to the plurality of output buffer stages to a high voltage rail and selectively coupling a second switch to the plurality of output buffer stages to a low voltage rail.

17. The method of claim 16, further comprising deactivating the one or more output buffer stages of the plurality of output buffer stages when the scan enable signal places the scan cell in the test mode.

18. The method of claim 15, further comprising deactivating the one or more output buffer stages of the plurality of output buffer stages such that no drive current flows through the deactivated one or more output buffer stages, thereby increasing the output latency of the scan cell.

19. The method of claim 15, wherein at least one of output buffer stages of the plurality of output buffer stages is not selectively activated and deactivated, and wherein the at least one output buffer stage is configured to provide drive current to the common output of the scan cell in both the test mode and the normal functioning mode.

20. The method of claim 15, wherein the output latency of the scan cell comprises a latency on a path between the output of the storage element and the common output of the memory element.

* * * * *